US010845440B2

(12) United States Patent
Trakimas et al.

(10) Patent No.: US 10,845,440 B2
(45) Date of Patent: Nov. 24, 2020

(54) PROGRAMMABLE GAIN AMPLIFIER WITH LINEAR IN DB GAIN CONTROL

(71) Applicants: Michael Trakimas, Cambridge, MA (US); Alexander Alexeyev, Beverly, MA (US)

(72) Inventors: Michael Trakimas, Cambridge, MA (US); Alexander Alexeyev, Beverly, MA (US)

(73) Assignee: WAVEGUIDE CORPORATION, Cambridge, MA (US)

( * ) Notice: Subject to any disclaimer, the term of this patent is extended or adjusted under 35 U.S.C. 154(b) by 87 days.

(21) Appl. No.: 15/935,815

(22) Filed: Mar. 26, 2018

(65) Prior Publication Data
US 2018/0275232 A1 Sep. 27, 2018

Related U.S. Application Data

(60) Provisional application No. 62/477,002, filed on Mar. 27, 2017.

(51) Int. Cl.
G01R 33/30 (2006.01)
G01R 33/36 (2006.01)
G01R 33/54 (2006.01)

(52) U.S. Cl.
CPC ....... G01R 33/3621 (2013.01); G01R 33/302 (2013.01); G01R 33/3607 (2013.01); G01R 33/3628 (2013.01); G01R 33/543 (2013.01)

(58) Field of Classification Search
None
See application file for complete search history.

(56) References Cited

U.S. PATENT DOCUMENTS

| 6,160,400 | A | 12/2000 | Friedrich et al. |
| 2010/0321020 | A1 | 12/2010 | Devries et al. |
| 2013/0154635 | A1 | 6/2013 | Mandal et al. |
| 2014/0029143 | A1* | 1/2014 | Lim ........ H03F 1/523 361/56 |
| 2015/0260813 | A1* | 9/2015 | Mandal ........ G01V 3/32 324/322 |

FOREIGN PATENT DOCUMENTS

| JP | 2005296459 A | 10/2005 |
| WO | 2015066005 A1 | 5/2015 |

OTHER PUBLICATIONS

International Search Report and Written Opinion for International Application No. PCT/US2018/024325 dated Jul. 19, 2018 11 pages.

* cited by examiner

Primary Examiner — Jermele M Hollington
Assistant Examiner — Suresh K Rajaputra
(74) Attorney, Agent, or Firm — Morgan, Lewis & Bockius LLP

(57) ABSTRACT

Various approaches of adjusting a gain of received signals in integrated circuitry include implementing an open-loop source-degenerated amplifier having a pair of input devices for amplifying the received signals; boosting an effective transconductance of the input devices (e.g., using a pair of super-$g_m$ feedback loops); and setting a bias current of devices in the open-loop source-degenerated amplifier (e.g., using a constant-$g_m$ bias circuit).

10 Claims, 4 Drawing Sheets

PROGRAMMABLE GAIN AMPLIFIER WITH LINEAR IN DB GAIN CONTROL

CROSS-REFERENCE TO RELATED APPLICATION

This application claims priority to and the benefit of, and incorporates herein by reference in its entirety, U.S. Provisional Patent Application No. 62/477,002, which was filed on Mar. 27, 2017.

FIELD OF THE INVENTION

The field of the invention relates, generally, to a sensor in integrated circuitry for receiving signals and, more particularly, to an integrated receiver in a nuclear magnetic resonance (NMR) system that provides gain control of a programmable-gain amplifier (PGA) therein.

BACKGROUND

An NMR system generally includes transceiver circuits for transmitting signals to a tested sample and receiving echo signals therefrom and a processor for analyzing the echo signals in order to obtain imaging and/or material information of the sample. Recently, significant efforts have been devoted to miniaturizing traditional NMR systems, in particular NMR transceivers. The numerous advantages of miniaturization include low cost, portability, and the fact that a micro-coil tightly surrounding a small sample increases the signal quality.

The practical design and construction of miniaturized NMR transceiver circuits, however, may present a number of difficulties. For example, designing a power-efficient integrated PGA featuring a constant gain and well-defined step sizes across process, voltage, and temperature (PVT) variations, as well as good linearity and high dynamic range and bandwidth, is difficult. If these often-conflicting design requirements are not met, then the overall performance of the receiver will suffer.

A PGA is commonly used in the analog front ends of many electronic receivers and analog sensors in various applications. The PGA allows the gain of the front end to be adjusted based on the amplitude of the input signal, thereby enabling the amplitude at the output of the receiver or sensor to be optimized for a wide dynamic range of input signals; this, in turn, allows the signal-to-noise (SNR) ratio to be maximized without allowing large input signal amplitudes to saturate the output stages. In addition, the PGA relaxes the requirements of the analog-to-digital converter (ADC) that often is used to digitize the output signal by optimizing the signal amplitude to fit within the dynamic range of the ADC.

Since the PGA typically has to handle a wide range of signal amplitudes, it is important for the gain of the amplifier, once set, to remain constant as the amplitude of the input signal varies so as to avoid introducing distortion to the signal. In addition, the amplifier gain should stay constant during changes in operating conditions, including PVT variations, to avoid the need to recalibrate the system gain (or to overdesign the programmable gain step size and overall range to compensate for these variations). The programmable step size of the PGA also needs to be well defined over these variations to simplify the gain control algorithm.

FIG. 1A depicts a conventional closed-loop PGA 100. The gain of the PGA 100 is determined by the impedance ratio $R_F/R_1$ and can thus be adjusted by varying the resistance of the programmable feedback resistor, $R_F$. The programmable resistor $R_F$ is commonly implemented as a network of resistors and switches, and the switches are digitally programmed to provide a selected resistance for each switch setting. The resistors $R_F$ can also be replaced by capacitors in a switched-capacitor implementation. The PGA 100 in FIG. 1A provides well-defined gain steps as well as high linearity and immunity to PVT variations. The closed-loop PGA 100, however, may suffer from either limited bandwidth or high power consumption.

FIG. 1B depicts a conventional open-loop PGA 110 that provides improved power efficiency for higher-bandwidth applications. The gain of the PGA 110 is determined by the transconductance, $g_m$, of a source-degenerated differential pair 112 and the resistance, $R_2$, of a load resistor 114. The gain can be adjusted by varying the resistance, $R_F$, of a programmable source-degeneration resistor 116 or the resistance $R_2$ of the load resistor. If the transconductance of the input devices is much larger than $1/R_2$, the effective transconductance of the source-degenerated differential pair 112 depicted in FIG. 1B is very close to $1/R_2$; therefore, the gain of the amplifier is set by the ratio of two resistors 114, 116 similar to the closed-loop architecture depicted in FIG. 1A. In practice, however, it is challenging to meet this requirement at higher bandwidths within a reasonable power budget. As a result, the gain of the PGA 110 depends on the transconductance of the input devices, which varies with signal amplitude as well as the PVT variations. This results in poor performance (e.g., degraded linearity, unstable gain, and ill-defined gain steps) of the open-loop PGA 110 compared to the performance of the closed-loop PGA 100.

Accordingly, there is a need for an approach that stabilizes the gain of a PGA in a receiver (or another sensor), independent of the amplitudes of the input signals and PVT variations. In addition, the PGA is desired to provide a broad bandwidth with low power consumption.

SUMMARY

Embodiments of the present invention allow the gain of an integrated PGA to be controlled with high linearity and well-defined gain steps over a wide input dynamic range and bandwidth, as well as across a wide range of PVT variations and operating conditions. In one implementation, the PGA includes an open-loop source-degenerated amplifier having input devices and a digitally programmable source-degeneration resistor for setting the gain. In some embodiments, the PGA includes one or more super-transconductance (super-$g_m$) feedback circuits around the input devices of the open-loop source-degenerated amplifier and a constant-transconductance (constant-$g_m$) bias circuit that sets the bias current for all devices in the PGA. This implementation allows the PGA to provide a constant gain and well-defined gain steps over a wide range of the input signals and across various operating conditions. In addition, the combination of these circuits advantageously leads to a more power- and area-efficient design compared to conventional architectures as shown in FIGS. 1A and 1B.

Accordingly, in one aspect, the invention pertains to a PGA including an open-loop source-degenerated amplifier having a pair of input devices; a pair of super-$g_m$ feedback loops, each coupled to one of the input devices for boosting an effective transconductance thereof; and a constant-$g_m$ bias circuit for setting a bias current of devices in the open-loop source-degenerated amplifier.

In some embodiments, the PGA further includes electronic devices (e.g., transistors) for forcing a current flowing through the input devices to be constant. In addition, the super-$g_m$ feedback loops may include transistors. In one embodiment, the constant-$g_m$ bias circuit is configured to automatically adjust the bias current so as to keep the effective transconductance of the input devices constant when changes in operating conditions, process, voltage or temperature occur. The PGA may also include a current mirror and a resistor for converting a current signal to a voltage signal at an output of the PGA.

In another aspect, the invention relates to an NMR apparatus including an NMR coil configured to enclose a sample; a receiver having an analog front-end structure and a PGA for adjusting a gain of the front-end structure based at least in part on an amplitude of NMR signals received from the sample, the PGA including (i) an open-loop source-degenerated amplifier having a pair of input devices, (ii) a pair of super-$g_m$ feedback loops, each coupled to one of the input devices for boosting an effective transconductance thereof, and (iii) a constant-$g_m$ bias circuit for setting a bias current of devices in the open-loop source-degenerated amplifier; and a controller configured to analyze the received NMR signals. The input devices may include a source-degenerated differential pair. In addition, the open-loop source-degenerated amplifier may include a programmable resistor for setting a gain of the PGA.

In some embodiments, the NMR apparatus further includes electronic devices (e.g., transistors) for forcing a current flowing through the input devices to be constant. In addition, the super-$g_m$ feedback loops may include transistors. In one embodiment, the constant-$g_m$ bias circuit is configured to automatically adjust the bias current so as to keep the effective transconductance of the input devices constant when changes in operating conditions, process, voltage or temperature occur. The NMR apparatus may also include a current mirror and a resistor for converting a current signal to a voltage signal at an output of the PGA.

Another aspect of the invention relates to a method of adjusting a gain of received signals in integrated circuitry. In various embodiments, the method includes amplifying the received signals using an open-loop source-degenerated amplifier having a pair of input devices; boosting an effective transconductance of the input devices; and setting a bias current of devices in the open-loop source-degenerated amplifier.

Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. The headings provided herein are for convenience only and are not intended to limit or interpret the scope or meaning of the claimed technology.

BRIEF DESCRIPTION OF THE DRAWINGS

In the drawings, like reference characters generally refer to the same parts throughout the different views. Also, the drawings are not necessarily to scale, with an emphasis instead generally being placed upon illustrating the principles of the invention. In the following description, various embodiments of the present invention are described with reference to the following drawings, in which.

DETAILED DESCRIPTION

Figure 2A:
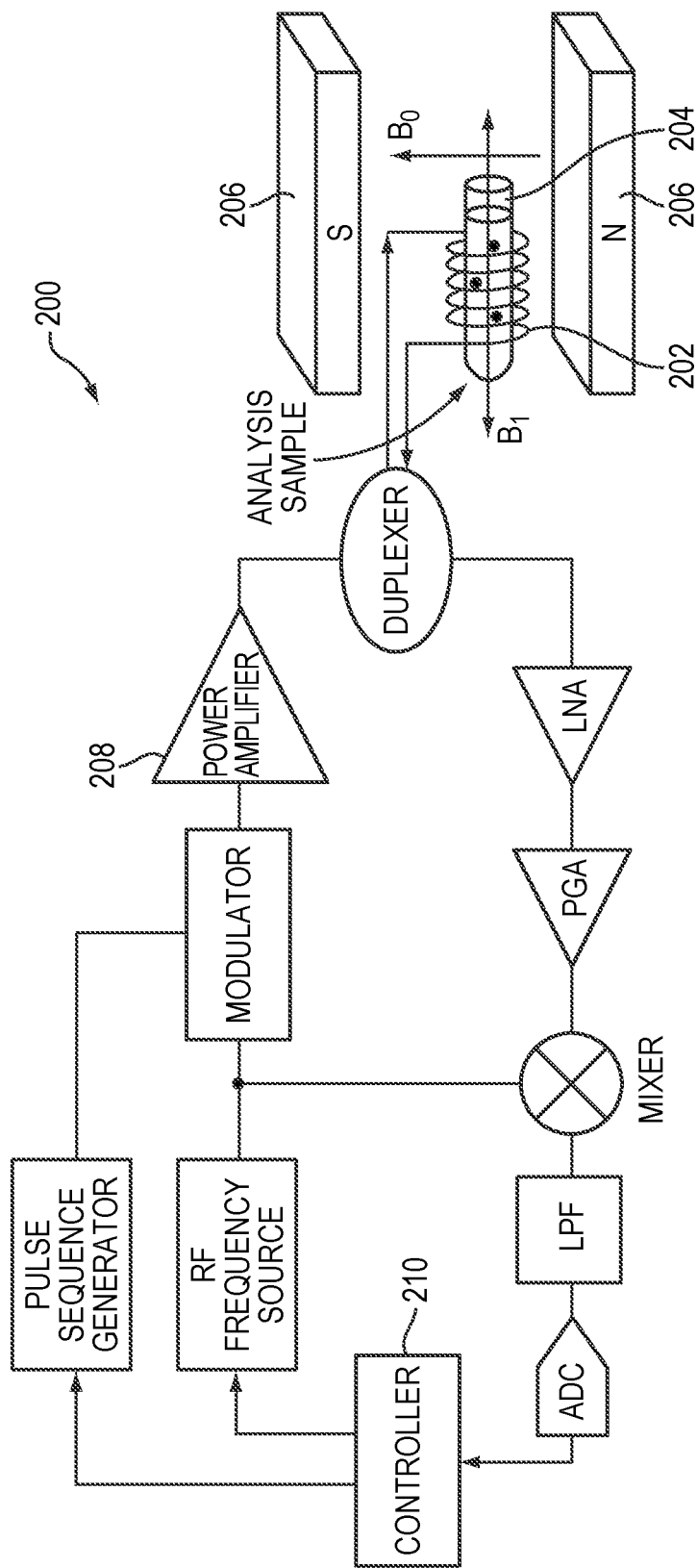
FIGS. 2A-2C schematically illustrate an exemplary NMR system in accordance with various embodiments.
Figure 2B:
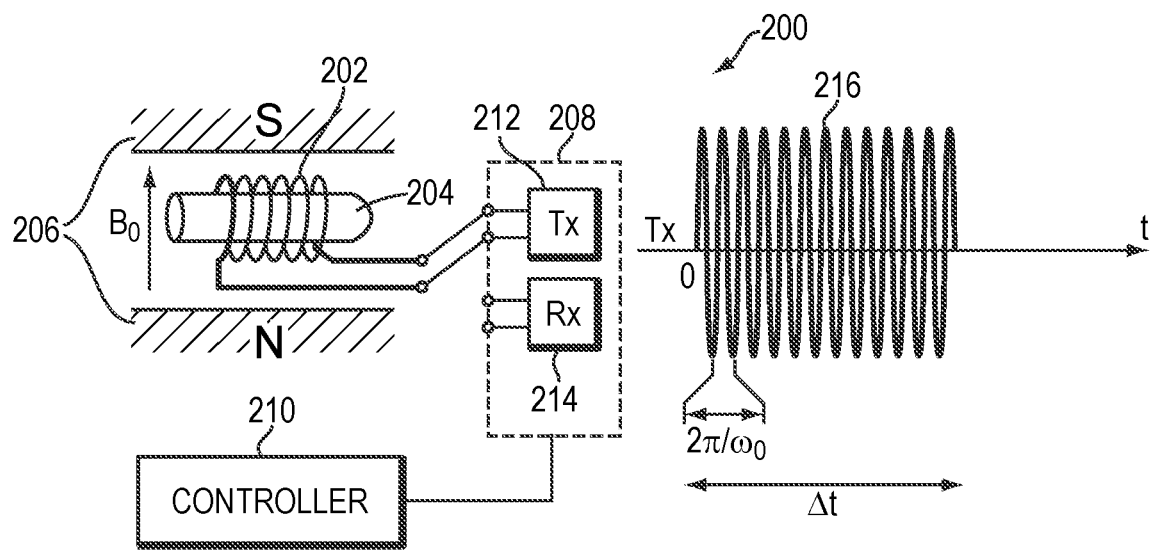

A sensor generally detects events or changes in its environment and sends the information to other electronics for analysis. For example, an NMR system may include an RF receiver to detect echo signals from a sample and subsequently transmit the signals to a processor for analyzing the material of the sample or generating an image. FIG. 2A illustrates an exemplary NMR system 200 in accordance with various embodiments of the present invention. The system 200 includes an NMR coil 202 surrounding a sample 204 being analyzed, a magnet 206 for generating a static magnetic field across the sample 204 and the coil 202, an RF transceiver 208 coupled to the NMR coil 202, and a controller 210 for controlling operation of the RF transceiver 208. In one implementation, with reference to FIGS. 2B and 2C, the transceiver 208 includes a transmitter (Tx) portion 212 for generating and transmitting RF signals to the sample 204 and a receiver (Rx) portion 214 for receiving echo signals from the sample 204.

During NMR measurements, the magnet 206 is activated to generate a substantially homogeneous magnetic field $B_0$ (e.g., within 0.1 parts per million (ppm) or, in some embodiments, within 100 ppm) across the sample 204; individual magnetic moments of the spins in the sample 204 may attempt to align with the applied field $B_0$. As a result, the magnetic moments of all the nuclei in the sample sum to a net magnetic moment that precesses about the axis of the field $B_0$ at a characteristic Larmor frequency, $\omega_0$, satisfying $\omega_0 = \gamma B_0$, where $\gamma$ is a gyromagnetic ratio. Because different nuclei have different values of the gyromagnetic ratio, measuring the Larmor frequency of the sample 204 allows material properties (e.g., the chemical composition) of the sample 204 to be revealed. In various embodiments, to observe precession of the net magnetic moment, the controller 210 causes the transmitter 212 to transmit an RF signal 216 (typically comprising a pulse sequence) having a resonant frequency substantially close (e.g., within ±1%) to the Larmor frequency $\omega_0$ to the coil 202; the coil 202 then generates an RF magnetic field that causes the net magnetic moment of the nuclei in the sample 204 to be "tipped" away from the axis of the static field $B_0$. Typically, the RF magnetic field has a time-dependent magnitude and is generated in a plane perpendicular to the axis of the static field $B_0$.

Figure 2C:
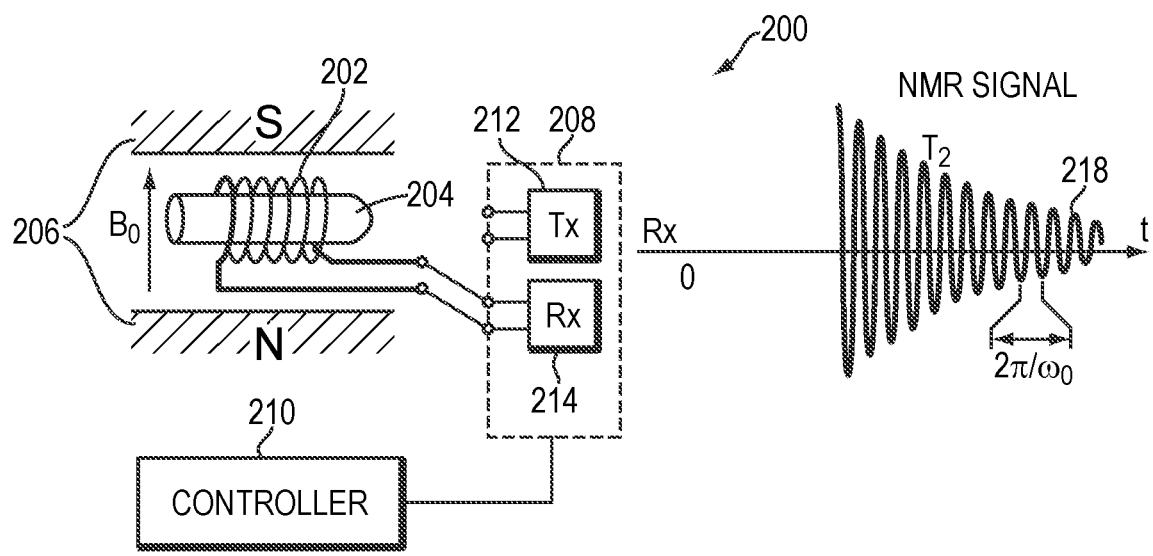

Referring to FIG. 2C, after a predetermined time duration, $\Delta t$, the transmitter 212 stops transmission of the $R_F$ excitation signal 216, and the coil 202 is switched via, for example, a mechanical or electrical switch (e.g., a transistor) to the receiver 214 for receiving the echo signals from the sample 204. Upon stopping the RF excitation, the nuclear spins within the sample 204 precess around the $B_0$-axis at the Larmor frequency $\omega_0$; this induces a corresponding signal oscillation. The nuclear spins then slowly lose phase coherence via spin-spin interactions, which manifest themselves in a macroscopic average as an exponential relaxation or damping signal 218 (referred to as "free induction decay") in the precession of the net magnetic moment. The oscillation and relaxation of the NMR signal can be detected by the coil 202. Because the spin-spin interactions are peculiar to the material of the sample 204 being tested, the characteristic time, commonly referred to as $T_2$, of the relaxation signal is also material-specific. Thus, by measuring the Larmor frequency $\omega_0$ (e.g., for spectroscopy) and/or characteristic time $T_2$ (e.g., for relaxometry), NMR techniques can be used as an analytic tool in a number of fields, including but not limited to chemical composition analysis, medical imaging, and bio-sensing. An exemplary NMR system is described in U.S. Pat. No. 8,643,368, the entire disclosure of which is hereby incorporated by reference.

Figure 3:
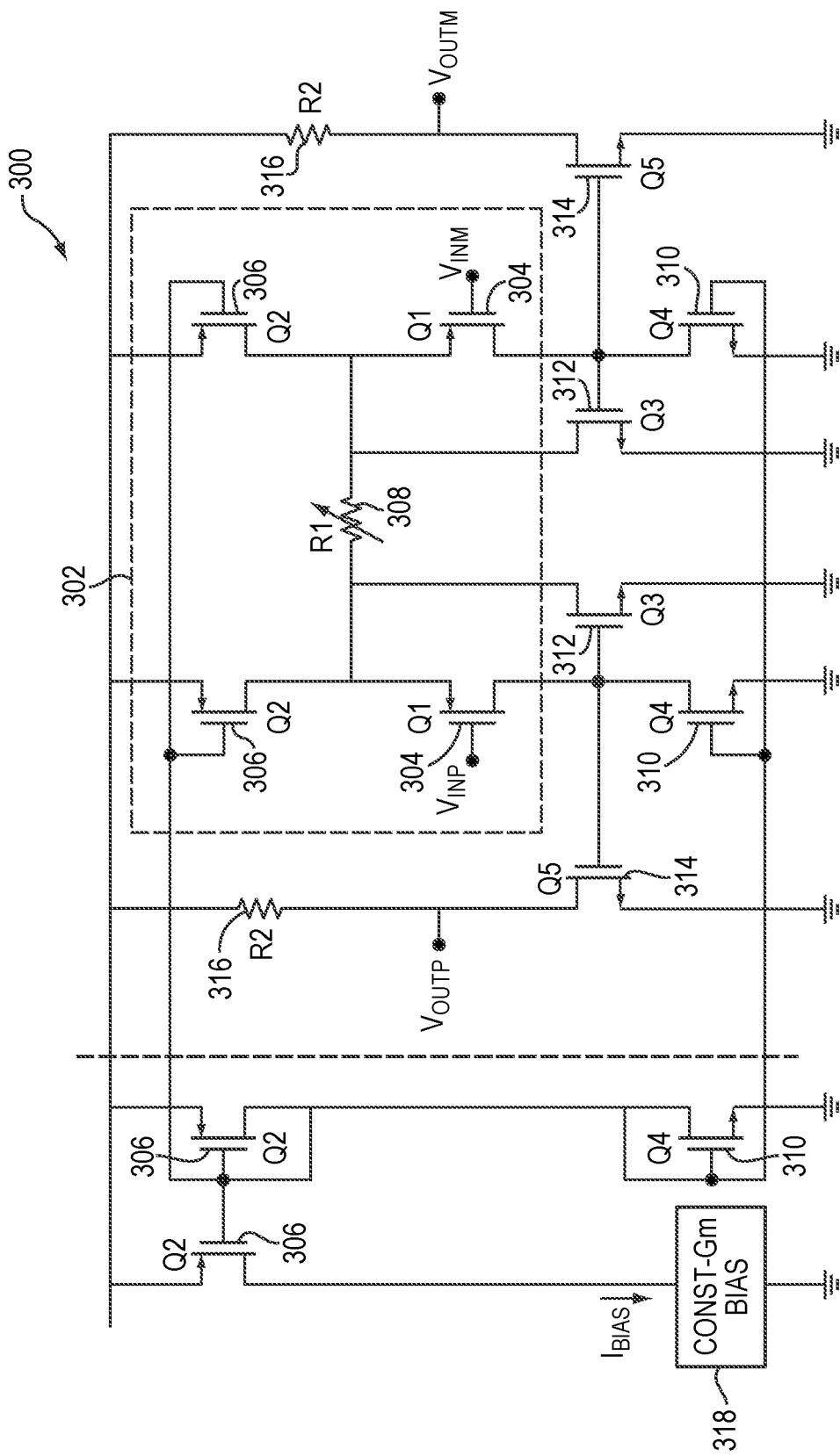
FIG. 3 schematically depicts an exemplary PGA implemented in a sensor/receiver in accordance with various embodiments.

In NMR applications, a PGA may be implemented in the RF receiver for adjusting the gain of the front-end components based on the amplitudes of the input signals, thereby enabling the amplitudes at the output of the receiver to be optimized for a wide dynamic range of input signals. FIG. 3 depicts an exemplary PGA 300 implemented in an RF receiver (or other sensors) in accordance with various embodiments of the present invention. In one embodiment, the PGA 300 includes an open-loop source-degenerated differential pair 302 having input devices (e.g., transistors 304, 306) for receiving input signals (e.g., RF signals). In addition, the PGA may include a programmable source-degeneration resistor 308 for setting the gain thereof—by varying the resistance $R_1$ of the programmable resistor 308, the gain of the PGA may be adjusted. In some embodiments, the PGA 300 further includes one or more devices (e.g., transistors) 310 for forcing the current flowing through the input transistors 304 to be constant. In addition, a super-$g_m$ feedback loop 312 may be added around the input transistors 304 to boost the effective transconductance of the input transistors 304 by the loop gain of the super-$g_m$ feedback loop 312. Because the current flowing through the input transistors 304 is constant, the input signals may appear fully across the resistor 308 and all the resulting AC currents can flow through the super-$g_m$ feedback transistors 312. The AC currents can then be mirrored, via one or more devices (e.g., transistors) 314, to one or more load resistors 316 having a resistance $R_2$; the load resistors 316 then convert the current back into a voltage signal at the output of the PGA 300.

In one embodiment, the super-$g_m$ feedback loop 312 includes one or more transistors; the loop gain can be determined by multiplying the parallel output impedance at the drains of the input transistors 304 and the transistors 310 by the transconductance of the super-$g_m$ feedback transistors 312. The boosted effective transconductance of the input transistors 304 may be closer to $1/R_1$ compared to that in the conventional open-loop PGA 110 (depicted in FIG. 1B); this allows the gain steps of the PGA 300 to be better-defined based at least in part on the impedance of the programmable resistor 308. In addition, because the super-$g_m$ feedback loop 312 boosts the effective transconductance of the input transistors 304, the dependence of the overall effective transconductance of the source-degenerated differential pair 302 on the transconductance of the input transistors 304 may be significantly reduced. As a result, the dependence of the PGA gain on the PVT variations may be advantageously reduced, increasing the performance (e.g., linearity and/or stability) of the PGA 300 compared to the conventional open-loop PGA 110.

In various embodiments, the PGA 300 further includes a constant-transconductance (constant-$g_m$) bias circuit 318 for reducing any residual dependence on the transconductance of the input transistors 304. The constant-$g_m$ bias circuit 318 may generate the bias currents of all the devices in the PGA 300 and may automatically adjust the bias currents so as to keep the transconductance of the input transistors 304 constant when changes in operating conditions, process, voltage and/or temperature occur. Accordingly, the impact on the PGA gain resulting from any residual dependence of the overall transconductance of the input differential pair on that of input transistors 304 may be advantageously avoided (or at least reduced). The constant-$g_m$ bias circuit can be any suitable design as is commonly implemented in many analog integrated-circuit applications (e.g., the constant-$g_m$ bias circuit described in "Razavi, B. (2001). *Design of Analog CMOS Integrated Circuits*. New York, N.Y.: McGraw-Hill."), and thus is readily available and straightforwardly implemented.

Figure 1A:
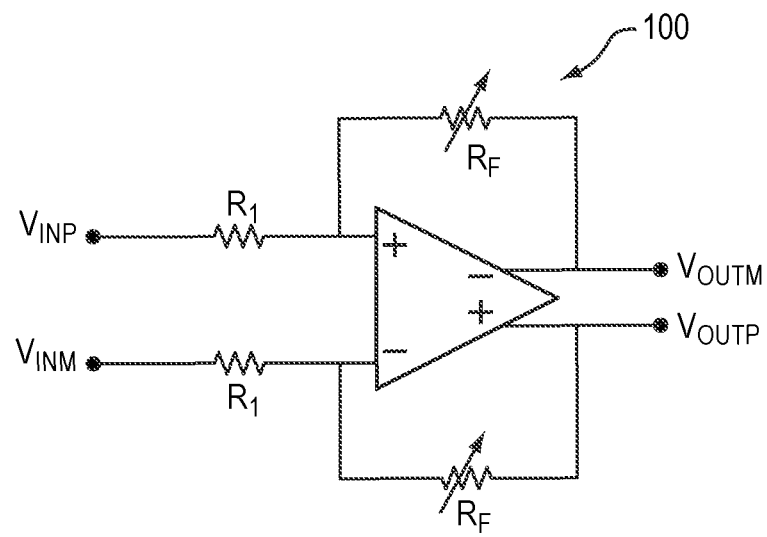
FIGS. 1A and 1B schematically illustrate architectures of a closed-loop PGA and an open-loop PGA, respectively, in accordance with the prior art.
Figure 1B:
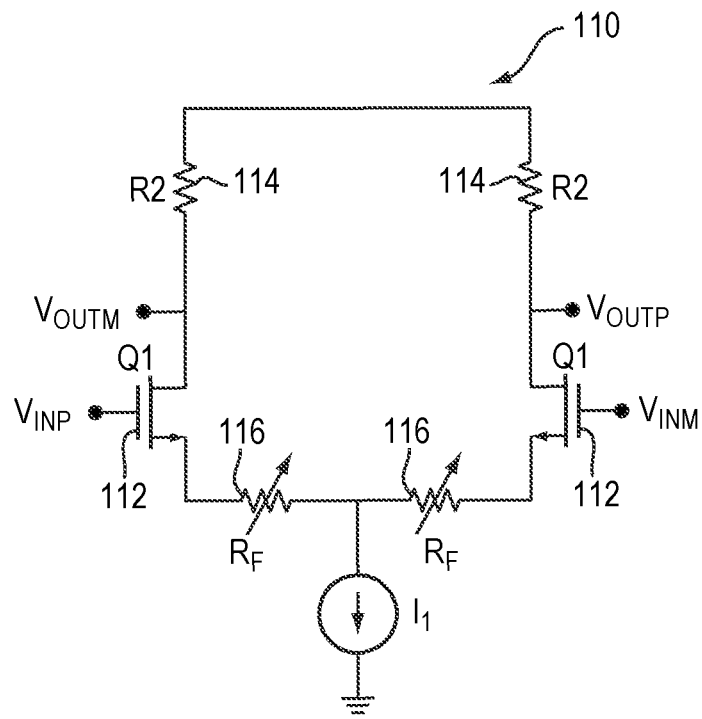

Accordingly, the integrated PGA 300 described herein utilizes a super-$g_m$ feedback loop 312 and/or a constant-$g_m$ bias circuit 318 to beneficially increase the effective transconductance of the input differential pair to be closer to $1/R_1$ than is the case in conventional open-loop amplifiers. The boosted effective transconductance of the input differential pair may provide gain stability over different operating conditions and PVT variations. In one embodiment, the overall gain of the PGA 300 is determined based on the impedance ratio of the load resistors 316 to the programmable source-degeneration resistors 308 (i.e., $R_2/R_1$); as a result, the PGA gain can be accurately set by the resistance ratio of the two resistors and may be immune to changes in operating conditions and PVT variations. The PGA 300 described herein thus provides similar benefits as the closed-loop implementation as illustrated in FIG. 1A. In addition, the PGA 300 described herein advantageously maintains the open-loop operation that leads to improved power efficiency and higher bandwidth capabilities. Further, the input transistors 304 may be made smaller while having larger effective transconductance than in other open-loop architectures; as a result, the preceding stage is loaded less, thereby allowing the PGA 300 to be designed with higher power efficiency for a given bandwidth.

It should be noted that the transistors 304, 306, 310, 312, 314 implemented in the PGA 300 may be any types of transistors, such as bipolar junction transistors (BJTs) or field-effect transistors (FETs). In one embodiment, the transistors are metal-oxide-semiconductor FETs (MOSFETs). In addition, embodiments of the PGA are not limited to implementations in RF receivers only and may be used in any suitable analog front-end components employed in various types of sensors. Further, NMR is an exemplary application that may beneficially utilize the PGA 300; one of ordinary skill in the art will understand that the sensor/receiver architecture described herein is suitable for many applications, which are thus within the scope of the invention.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An NMR apparatus comprising:
    an NMR coil configured to enclose a sample;

a receiver comprising an analog front-end structure and a PGA for adjusting a gain of the front-end structure based at least in part on an amplitude of NMR signals received from the sample, the PGA comprising (i) an open-loop source-degenerated amplifier comprising a pair of input devices, (ii) a pair of super-gm feedback loops, each coupled to one of the input devices for boosting an effective transconductance thereof, and (iii) a constant-$g_m$ bias circuit for setting a bias current of devices in the open-loop source-degenerated amplifier; and a controller configured to analyze the received NMR signals.

2. The NMR apparatus of claim 1, wherein the input devices comprise a source-degenerated differential pair.

3. The NMR apparatus of claim 1, wherein the open-loop source-degenerated amplifier comprises a programmable resistor for setting a gain of the PGA.

4. The NMR apparatus of claim 1, further comprising electronic devices for forcing a current flowing through the input devices to be constant.

5. The NMR apparatus of claim 4, wherein the electronic devices comprise transistors.

6. The NMR apparatus of claim 1, wherein the super-$g_m$ feedback loops comprise transistors.

7. The NMR apparatus of claim 1, wherein the constant-$g_m$ bias circuit is configured to automatically adjust the bias current so as to keep the effective transconductance of the input devices constant when changes in operating conditions, process, voltage or temperature occur.

8. The NMR apparatus of claim 1, further comprising a current mirror and a resistor for converting a current signal to a voltage signal at an output of the PGA.

9. The NMR apparatus of claim 1, wherein each of the pair of super-$g_m$ feedback loops comprises a super-$g_m$ transistor comprising:

a source/drain coupled to a first source/drain of its corresponding input device; and a gate coupled to a second source/drain of its corresponding input device.

10. The NMR apparatus of claim 1, wherein the pair of super-$g_m$ feedback loops are configured to boost an effective transconductance of the input devices.

* * * * *